United States Patent [19]
Nakano et al.

[11] Patent Number: 6,004,866
[45] Date of Patent: *Dec. 21, 1999

[54] METHOD FOR MANUFACTURING BONDED WAFER AND BONDED WAFER MANUFACTURED THEREBY

[75] Inventors: Masatake Nakano; Kiyoshi Mitani, both of Annaka; Masahiro Sakai, Koshoku, all of Japan

[73] Assignee: Shin-Etsu Handotai, Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/808,655

[22] Filed: Feb. 28, 1997

[30] Foreign Application Priority Data

Mar. 18, 1996 [JP] Japan .................................. 8-060451

[51] Int. Cl.$^6$ .......................... H01L 21/30; H01L 21/46; H01L 21/302; H01L 21/461
[52] U.S. Cl. ........................................... 438/459; 438/692
[58] Field of Search ................................... 451/285, 286, 451/287, 288, 289; 438/455, 459, 691, 692

[56] References Cited

PUBLICATIONS

T. Abe et al., "Wafer Bonding Technique for Silicon–on–Insulator Technology", *Solid State Technology*, vol. 33, No. 11, Nov. 1, 1990, pp. 39–40.

J. Haisma et al., "Improved Geometry of Double–Sided Polished Parallel Wafers Prepared for Direct Wafer Bonding", *Applied Optics*, vol. 33, No. 34, Dec. 1, 1994, pp. 7945–7954.

J. Haisma et al., "Silicon–wafer Fabrication and (Potential) Applications of Direct–Bonded Silicon", *Philips Journal of Research*, vol. 49, No. 1–2, 1995, pp. 65–89.

W.P. Maszara, "Silicon–On–Insulator By By Wafer Bonding: A Review", *Journal of the Electrochemical Society*, vol. 38, No. 1, Jan. 1, 1991, pp. 341–347.

*Primary Examiner*—Brian Dutton
*Attorney, Agent, or Firm*—Oliff & Berridge, PLC

[57] ABSTRACT

A method for manufacturing a bonded wafer comprises the steps of; mirror-polishing a surface of first and second substrates, bringing the mirror-polished surfaces of the substrates contact with each other to join them, and subjecting the substrates to a heat treatment to firmly bond them. One of the surfaces of the first and second substrates prior to bonding, or one surface of the bonded wafer is subjected to a polishing treatment for exerting little influence by irregularities on a rear surface of the one substrate or by a figure of a surface of a polishing plate which is in contact with the rear surface of the one substrate.

20 Claims, 4 Drawing Sheets

FIG.1A    POLISHING
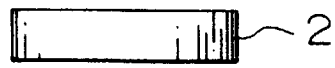
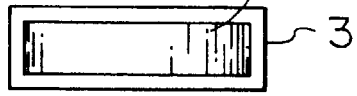
FIG.1B    FORMATION OF INSULATING LAYER
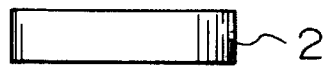
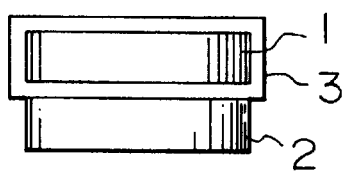
FIG.1C    JOINING
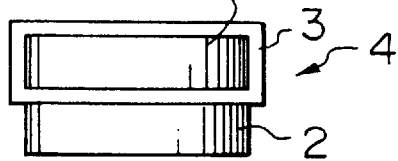
FIG.1D    BONDING
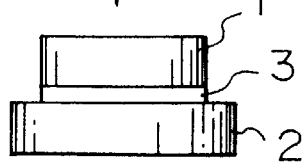
FIG.1E    THINNING SOI LAYER
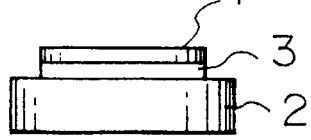
FIG.1F    POLISHING

METHOD FOR MANUFACTURING BONDED WAFER AND BONDED WAFER MANUFACTURED THEREBY

BACKGROUND OF THE INVENTION

1. Field of the Invention

The present invention relates to a technique for bonding two pieces of substrates to each other, for example, to a technique to realize a bonded wafer having an SOI (silicon on insulator) structure, in which two pieces of silicon mirror wafers are joined through an oxide film without an adhesive and thereafter one of the bonded wafer pieces is thinned, to a technique for directly bonding semiconductor substrates to each other through no oxide film, and the like.

2. Description of Related Art

Particularly, in a technique for a semiconductor substrate having an SOI structure, one manufactured by the so-called SIMOX (separation by implanted oxygen) method in which oxygen ions are heavily implanted into a silicon single crystal and thereafter a heat treatment is carried out to form an oxide film, has been watched as a superior SOI wafer and researches therefor have been prosecuted. The SIMOX method is excellent in uniformity of the thickness of the thin SOI layer because the thickness of the SOI layer to form an active region for a device can be determined by the accelerating voltage at the time of the implantation of oxygen ions. However, in the method, there are a lot of problems, for example, about the reliability of the oxide film, the necessity of a heat treatment at a temperature not less than 1,300° C. in order to recover the crystallinity of a silicon layer which was changed to an amorphous state, and the like.

A type of bonded wafer manufactured by bonding two pieces of silicon wafers with mirror finished surfaces to each other has been watched as another wafer having an SOI structure. The method therefor will be explained as follows.

When the mirror surfaces of the two pieces of silicon wafers are brought contactwith each other under a clean condition, after forming an oxide film on the mirror surface of at least one of the two pieces of silicon wafers, these wafer pieces are joined to each other through the oxide film without an adhesive (hereinafter, this state may be referred to as the "joining"). Because such a joining state is not a perfect one, a heat treatment is then carried out to the joined wafer pieces to firmly bonded with each other (hereinafter, this state may be referred to as the "bonding"). Thereafter, the one (hereinafter, the surface thereof may be referred to as the "main surfacer") of the bonded wafer pieces in the side in which an active region for a device will be formed is thinned by wet etching or by grinding, and then the thinned surface is polished. Thus, a bonded wafer with a thinned SOI layer is obtained. In this case, it is required that the silicon layer in the side to be thinned comprises a single crystal.

Because such a bonded wafer requires no interposition of foreign material such as an adhesive between the wafer pieces, the bonded wafer provides the advantages that subsequent high temperature heat treatments or various types of chemical treatments can be freely performed and a dielectric layer can be easily buried therein. Recently, in cooperation with improvement of thin film technology, e.g., improvement of flatness, cleanliness or the like, the technique for manufacturing a bonded wafer has come to attract special attention.

The SOI layer of a bonded wafer tends to become thinner by the requirement of larger scale integration and of higher speed of semiconductor devices. Recently, a bonded wafer having an extremely thin SOI layer, e.g., of not more than 1 $\mu$m, has been required. In such a bonded wafer, uniformity of the thickness of the thinned SOI layer or processing accuracy thereof is a problem.

For example, in order to achieve the thickness of the SOI layer which is equal to or less than that of SIMOX, for a future complementary MOS substrate, it is required to realize an average thickness of the SOI layer not larger than 0.1 $\mu$m and a processing accuracy of thickness being within at least ±0.01 $\mu$m. It is preferable that the SOI layer thickness distribution after thinning has a standard deviation not larger than 2 nm, when comparing it with that of the SOI layer of the existing SIMOX wafer. However, a conventional bonded wafer has a limit of the processing accuracy of the SOI layer thickness, which is about ±0.03 $\mu$m for an average thickness of SOI layer of 1 $\mu$m. Herein, the processing accuracy of thickness is considered to correspond to three times the standard deviation value.

Recently, a method in which the layer thicknesses of an SOI wafer are measured at a plurality of points and the SOI layer can be thinned to about 0.1 $\mu$m on the basis of the obtained layer thickness distribution, has been developed. However, according to the method, it is considerably difficult to stably obtain a satisfactory processing accuracy of thickness, for example, an SOI layer thickness distribution having a standard deviation not larger than 2 nm.

The present inventors have studied and examined various measures to overcome the limit. As a result, it has been found that the limit is due to the finish processing accuracy of the mirror surfaces of a wafer prior to bonding and due to the processing accuracy in the previous step prior to the step for working the SOI layer to have a thickness of 0.1 $\mu$m.

That is, it has been found that the thickness distribution of the SOI layer of the bonded wafer which was thinned to 0.1 $\mu$m by a method with a conventional processing accuracy, is very similar to the distribution of small irregularities (hereinafter, referred to as the "peels") which is detected in an observation of a general mirror wafer surface through a magic mirror (an evaluation of a mirror surface by light reflection). It is said that the peels are created by the irregularities on the rear surface of a wafer or the figure of the surface of a polishing plate which is in contact with the rear surface of the wafer, being transferred onto the front surface of the wafer during polishing the wafer. From this matter, it is considered that the thickness irregularity of the thinned layer of the bonded wafer is caused due to being not able to completely remove the peels of the wafer which were created during a polishing step, e.g., the wax-mounting polishing method which is generally used, or the like, and therefore, the thickness distribution of the thinned layer is dependent on the peel distribution of the wafer.

Because the peels are wave-like irregularities having small heights or shallow depths in the range of 0.01–0.1 $\mu$m in peak-to-valley value, and a large period in the range of 1–20 mm, such peels cannot be detected by a general measurement device for measuring an LTV (local thickness variation) or a surface roughness. Therefore, in conventional manufacturing processes of an SOI wafer having an SOI layer with a thickness of not less than 1 $\mu$m, the existence of the peels did not become an issue because the conventional processing accuracy of the layer thickness was out of the range of ±0.3 $\mu$m.

Such peels can be observed by using a magic mirror and the size thereof can be measured by a contact probe roughness measurement apparatus.

On the other hand, recently, a measure to counter generation of particles and dust comes to be important in manufacturing processes of semiconductor devices. Therefore, it has been required to suppress generation of dust by polishing the rear surface of the silicon mirror wafer which was not an issue in the past.

SUMMARY OF THE INVENTION

The present invention was developed in view of these problems.

An object of the present invention is to obtain a bonded wafer having a uniform thickness and a higher processing accuracy by obtaining a wafer with no peel or by dissolving formation of peels on the wafer surf ace in a manufacturing process of the bonded wafer.

That is, in accordance with one aspect of the present invention, the method for manufacturing a bonded wafer comprises the steps of; mirror-polishing a surface of a first substrate, mirror-polishing a surface of a second substrate, bringing the mirror-polished surfaces of the first and second substrates contact with each other to join the substrates to each other, and subjecting the first and second substrates to a heat treatment to firmly bond the substrates to each other, wherein at least one of the two mirror-polishing steps of the surfaces of the first and second substrates is performed by a polishing treatment for exerting little influence by irregularities on a rear surface of the one substrate or by a figure of a surface of a polishing plate which is in contact with the rear surface of the one substrate.

According to the method, it is possible to obtain a bonded wafer comprising first and second substrates directly bonded to each other, having a uniform thickness and a higher processing accuracy. The method has basically no limitation with respect to the material for the substrates to be bonded, and it is also applicable to various types of directly bonded wafers, e.g., a directly bonded wafer of heavily and lightly doped silicon substrates to each other, a bonding of a conductive, semiconductive or superconductive substrate to a quartz substrate, formation of a semiconductor heterostructure such as a direct bonding of different types of compound semiconductor substrates or a bonding of a GaAs substrate on an Si substrate, and the like.

Preferably, both the first and second pieces of wafers comprise silicon. The polishing treatment for exerting little influence by irregularities on the rear surface of the one substrate or by the figure of the surface of the polishing plate which is in contact with the rear surface of the one substrate, is preferably performed by a polishing method in which the one substrate is held without fixing the rear surface thereof. The polishing method may be one selected from a double side polishing method, a polishing method in which the rear surface of the one substrate is held on a soft surface of a holding member to absorb the irregularities on the rear surface of the one substrate, during polishing, and a polishing method in which the front surface of the substrate is polished with an polishing cloth while the rear surface thereof is held in a hole with a diameter slightly larger than that of the wafer, of a substrate supporting member.

In accordance with another aspect of the present invention, the method for manufacturing a bonded silicon wafer comprises the steps of; mirror-polishing a surface of a first piece of wafer, mirror-polishing a surface of a second piece of wafer, forming an insulating film such as an oxide film, on at least one of the mirror-polished surfaces of the first and second pieces, bringing the mirror-polished surfaces of the first and second pieces of wafers contact with each other through the insulating film to join the first and second pieces to each other, and subjecting the first and second pieces to a heat treatment to firmly bond the pieces to each other, wherein at least one of the two mirror-polishing steps of the surfaces of the first and second pieces of wafers is performed by a polishing treatment for exerting little influence by irregularities on a rear surface of the one piece or by a figure of a surface of a polishing plate which is in contact with the rear surface of the one piece.

According to the method, it is possible to prevent generation of peels on at least one of the polished surfaces of the first and second pieces. Consequently, in the subsequent mirror-polishing for a surface of the bonded wafer such as an SOI layer, it is possible to remove the adverse effect of peels to the finish processing accuracy of thickness thereof.

In such a method, particularly, it is preferable to further comprise the steps of, thinning one of the firmly bonded substrates by wet-etching or grinding, and polishing the thinned one. The method may further comprise the steps of, thinning one of the firmly bonded substrates by wet-etching or grinding, polishing the thinned one, and further thinning the polished thinned one by a vapor-phase etching to form a thin semiconductor layer. The step of further thinning by a vapor-phase etching preferably comprises, measuring a thickness distribution of the one of bonded substrates to be previously made thinner to make a map of the thickness distribution, and locally thinning a thicker portion thereof by a vapor phase etching which is numerically controlled. This method is generally called as the PACE (plasma assisted chemical etching) method. According to the method further comprising such steps, it is possible to stably obtain a satisfactory processing accuracy of thickness, for example, an SOI layer thickness distribution having a standard deviation not larger than 2 nm.

In accordance with another aspect of the present invention, the method for manufacturing a bonded silicon wafer comprises the steps of; mirror-polishing a surface of a first substrate, mirror-polishing a surface of a second substrate, forming an insulating film such as an oxide film, on at least one of the mirror-polished surfaces of the first and second substrates, bringing the mirror-polished surfaces of the first and second substrates contact with each other through the insulating film to join the first and second substrates to each other, subjecting the first and second substrates to a heat treatment to firmly bond the substrates to each other, thinning one of the firmly bonded substrates, by wet-etching or grinding, and thereafter subjecting the thinned one of the bonded substrates to a polishing treatment for exerting little influence by irregularities on a rear surface of the one substrate or by a figure of a surface of a polishing plate which is in contact with the rear surface of the one substrate.

According to the method, it is possible to obtain a bonded wafer such as a bonded wafer of an SOI structure, having a uniform thickness and a higher processing accuracy, by subjecting the one of the bonded substrates to a polishing treatment for exerting little influence by irregularities on a rear surface of the one substrate or by a figure of a surface of a polishing plate.

In accordance with another aspect of the present invention, the bonded wafer is one manufactured by one of the above methods.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein;

FIGS. 1A–1F are schematic sectional views showing steps of manufacturing a bonded wafer having an SOI structure;

PREFERRED EMBODIMENT OF THE INVENTION

Figure 2A:
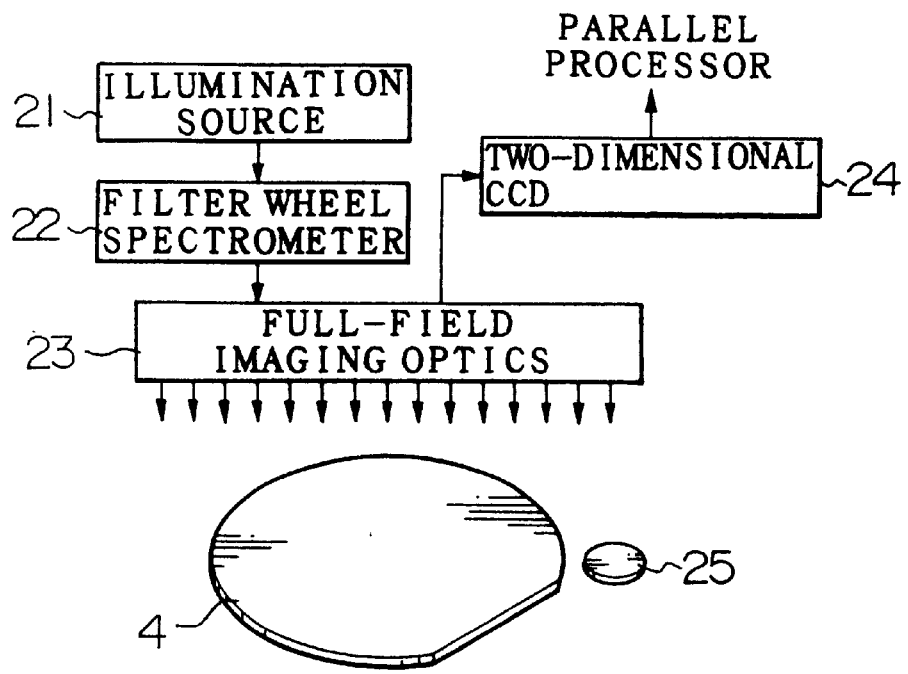
FIG. 2A is a view for showing a conception of a measuring method for a thin layer of an SOI wafer in the PACE method.

Embodiments of a method for manufacturing a bonded wafer according to the present invention will be explained with reference to the drawings, as follows.

FIGS. 1A–1F show steps of manufacturing a bonded silicon wafer having an SOI structure in an embodiment of the present invention. First, two pieces of silicon wafers, that is, a piece of wafer 1 (hereinafter, referred to as the "bond wafer" or "first substrate") for forming SOI layer and another piece of wafer 2 (hereinafter, referred to as the "base wafer" or "second substrate") for making a supporting substrate are prepared, and at least a surface of the first and second substrates 1 and 2 is mirror-polished by a suitable polishing method, as shown in FIG. 1A. The polishing method is selected from the so-called wax-mounting polishing method, the double side polishing method, a polishing method in which the rear surface of the substrate is held on a soft surface of a holding member to absorb the irregularities on the rear surface of the one substrate, a polishing method in which the front surface of the substrate is polished with an polishing pad while the rear surface thereof is held in a hole with a diameter slightly larger than that of the wafer, formed in a substrate supporting member, or the like. Thereafter, on at least one of the mirror-polished surfaces of the first and second substrates 1 and 2, an insulating layer 3 such as an oxide film is formed by atmospheric or high pressure thermal oxidation, plasma oxidation, or the like. The mirror-polished surfaces of the first and second substrates 1 and 2 are brought into contact with each other through the insulating film 3 under a room temperature to join these substrates to each other, as shown in FIG. 1C. Thereafter, a heat treatment is carried out to the joined substrates 1 and 2 to firmly bond with each other, and thus a bonded wafer 4 is formed, as shown in FIG. 1D. The temperature of the heat treatment and the time therefor are preferably in the range of 800–1200° C. and of 30–300 minutes, respectively. Next, the main surface of the first substrate 1 for making an SOI layer of the bonded wafer 4 is thinned to a thickness of 10–20 μm by wet etching, surface grinding or the like, as shown in FIG. 1E. Further, a mirror polishing treatment is performed to the thinned surface to make a bonded wafer of an SOI structure, as shown in FIG. 1F. At this stage, an SOI layer 1 having a thickness of 3±0.5 μm is obtained.

Although the insulating film 3 is formed on the first substrate 1 (bond wafer) in many cases, there is also a case where the insulating film is formed on the second substrate 2 (base wafer). Therefore, the insulating film 3 may be formed on either or both the two substrates 1 and 2.

Next, the SOI layer 1 of the bonded wafer 4 is further thinned to a thickness of 0.1±0.01 μm. In order to realize such an SOI layer having an average thickness and a processing accuracy of 0.1±0.01 μm, to the above bonded wafer, various methods have been studied. For example, the so-called PACE (plasma assisted chemical etching) method which is one for making a layer thinner by a vapor phase etching is known, as shown in U.S. Pat. No. 5,254,830 in detail. In this method, the thickness distribution of a silicon layer to be made thinner is previously measured to make a map of thickness distribution, and the thicker portions of the layer are locally thinned by a vapor phase etching which is numerically controlled. These steps are repeatedly performed as needed. Such a PACE method can be used to further thin the above SOI layer in the method of the present invention.

In the method of the present invention, for example, the layer thickness of the bonded wafer 4 having the SOI layer with a thickness of 3±0.5 μm which was finished by the above-described polishing steps as shown in FIGS. 1A–1F, are simultaneously measured at points spaced at 1–3 mm over the entire surface of the bonded wafer 4 in two dimension. For such a measurement of thickness of an SOI layer, various types of measurement devices, e.g., a white light interferometry, an ellipsometer, a high frequency acoustic wave device, a full surface interferometer and the like, may be used. For example, in an embodiment of the measurement method shown in FIG. 2A, lights emitted from an illumination source 21 are uniformly illuminated to the whole surfaces of the bonded wafer 4 having the SOI layer 1 to be measured and of a calibration standard wafer 25 through a filter wheel spectrometer 22 and a full-field imagingoptics 23. Thereafter, the intensity of the reflected lights from the entire upper surfaces of the bonded wafer 4 and from the calibration standard wafer 25 are simultaneously measured in two dimension by using a two-dimensional CCD (charge-coupled device) 24. These reflected light intensity data from the entire upper surfaces of the bonded wafer 4 and the calibration standard wafer 25 are sent to a parallel data processor (not shown). The parallel data processor processes the reflected light intensity data from the entire upper surface of the bonded wafer 4 having the SOI layer 1 and from the calibration standard wafer 25, and then makes a map of thickness distribution of the SOI layer 1 of the bonded wafer 4 at points spacedat 1–3 mm over the entire surface thereof, on the basis of the processed data.

Figure 2B:
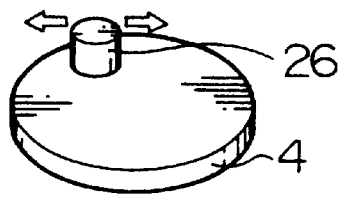
FIG. 2B is a perspective view showing a conception of thinning in the PACE method.
Figure 2C:
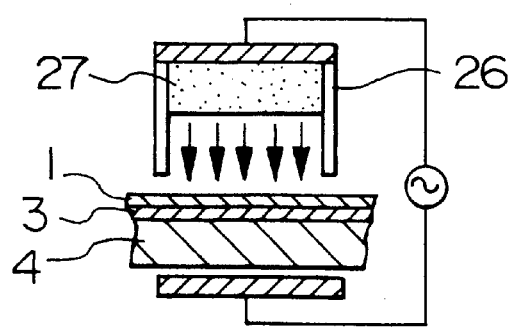
FIG. 2C is an enlarged sectional view of a part of FIG. 2B.

Thick portions of the SOI layer 1 of the bonded wafer 4 are locally made thinner by a vapor phase etching device 26 using an RF plasma 27 on the basis of the map of thickness distribution of the SOI layer 1, as shown in FIG. 2B. The etching device 26 includes an RF plasma generating means and a chamber for supplying the generated plasma onto the upper surface of the SOI layer 1 of the bonded wafer 4, as shown in FIG. 2C, and can be relatively moved with respect to the bonded wafer 4 in two orthogonal horizontal directions. As a result, a bonded wafeer 4 having the SOI layer 1 with an average thickness of 0.1 μm can be made.

The present invention introduces a polishing step for a surface of at least one of the substrates before bonding or for a surface of the bonded wafer, which exerts little influence by irregularities on a rear surface of the substrate or by a figure of a surf ace of a polishing plate which is in contact with the rear surface of the substrate, which is the cause of the above-described peel-creation. That is, in this embodiment for manufacturing a bonded wafer having an SOI layer, it is required that at least one of the two mirror-polishing steps of the surfaces of the first and second substrates and of the polishing step of the SOI layer of the bonded wafer is performed by a polishing treatment for exerting little influence by irregularities on a rear surface of the substrate or the wafer, or by a figure of a surface of a polishing plate which is in contact with the rear surface of the substrate or the wafer.

For such a substrate polishing step, a method in which the substrate is polished while being held without fixing the rear surface of the substrate; for example, the so-called double side polishing method; a polishing method by using a substrate supporting member which has a hole with a diameter a little larger than that of the substrate; and a method for polishing while holding the rear surface of a substrate by a substrate holding member while absorbing the irregularities on the rear surface of the substrate or the irregularities on the surface of a polishing plate, or the like, may be used.

Figure 3:
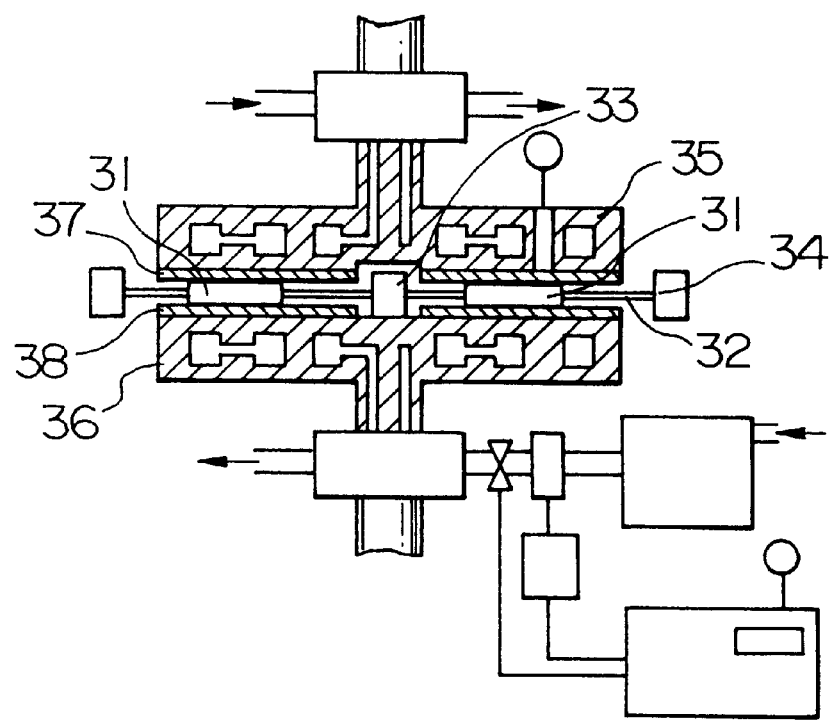
FIG. 3 is a schematic view showing an embodiment of a double side polishing apparatus used in the present invention.

The double side polishing method is one for polishing both the front and rear surfaces of a substrate at the same time while holding the substrate in a holeof a carrier without fixing, which has a diameter slightly larger than that of the substrate. A schematic view of a double side polishing apparatus is shown in FIG. 3. In this Figure, for example, a plurality of substrates 31 are loaded in the holes of some carriers 32 made of a resin or the like, each of which has a thickness slightly smaller than the desired final thickness of the substrates 31 and is arranged to engage with a sun gear 33 and an internal gear 34. The carriers 32 revolve both round the sun gear 33 and on their axes by rotation of a lower turn table 36. Consequently, both surfaces of the substrates 31 in the carriers 32 can be simultaneously polished by polishing pads 37 and 38 made of an artificial leather or the like which are adhered on upper and lower turn tables 35 and 36, while an polishing slurry, e.g., an alkali aqueous solution including polishing grains of colloidal silica or the like, is supplied to the upper and lower polishing pads 37 and 38.

According to the method, because not only the front surface of a substrate but the rear surface thereof are polished, it is possible to suppress generation of dust from the rear surface. Therefore, it is possible to solve also the problem of generation of particles in manufacturing processes of semiconductor devices.

In the polishing method by using a substrate supporting member which has a hole slightly larger than the diameter of the substrate, polishing for the front surface of the substrates is carried out by using a polishing pad made of an artificial leather or the like which is adhered on a turn table, while an polishing slurry, e.g., an alkali aqueous solution including polishing grains of colloidal silica or the like, is supplied to the polishing pad, and holding the substrates without fixing of the rear surface in the holes of the supporting member called a template which is made of hard synthetic resin or the like and has holes with a diameter slightly larger than that of the substrate which is the object to be polished.

Figure 4:
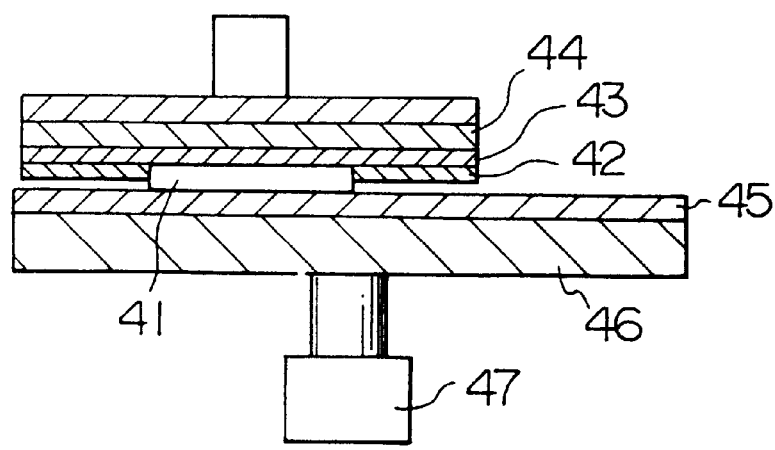
FIG. 4 is a schematic sectional view showing an embodiment of a polishing apparatus using a substrate holding member.

A schematic view of an embodiment of an apparatus for polishing a front surface of a substrate while holding the rear surface of the substrate by using a substrate holding member, is shown in FIG. 4. In this Figure, in order to prevent a shift of the substrate position, the substrates 41 are loaded in the holes of the substrate holding member 42, each of which has a diameter slightly larger than that of the substrates 41. The substrate 41 is held on the surface of a porous pad (backing pad) 43 which is adhered on a plate 44 and is made of synthetic resin in cooperation with the absorbability of water although the substrate 41 is not completely fixed. The front surfaces of the substrates 41 in the substrate holding member 42 can be polished by a polishing pad 45 made of an artificial leather or the like adhered on a lower turn table 46 which is rotated by a motor 47, while an polishing slurry, e.g., an alkali aqueous solution including polishing grains of colloidal silica or the like, is supplied to the polishing pad 45. The substrate 41 is slowly rotated on its axis, while absorbing the irregularities on the rear surface of the substrate 41 by the porous pad (backing pad) 43 which is relatively soft, during polishing, it is possible to remove an adverse effect of the irregularities on the rear surface of the substrate.

It is preferable that the thickness distribution of the thinned SOI layer has a standard deviation not larger than 2 nm, when comparing it with that of an SOI layer of the existing SIMOX wafer. The reason for this is that when the standard deviation of the thin layer is larger than 2 nm, the layer thickness distribution of the bonded wafer having an extremely thin SOI layer becomes larger to introduce a problem when manufacturing a semiconductor device.

Next, the present invention will be explained by illustrating preferred examples.

EXAMPLE 1

A p-type of silicon single crystal wafer piece having a diameter of 5 inch was mirror-polished by a well-known wax-mounting method for making a bond wafer piece. In this polishing, the entire polishing stock removal was about 10 $\mu$m, and the polishing was continued so long as the rms (root-mean-square) value of the surface microroughness was larger than 0.3 nm (measured area: 250 $\mu$m×250 $\mu$m) which was measured by the phase shift interferometry method.

Next, the polished wafer piece was oxidized in an atmosphere of oxygen including vapor at a temperature of about 1050° C. for about 40 minutes to form an oxide film with a thickness of about 0.5 $\mu$m on the surface of the bond wafer piece.

On the other hand, a p-type of silicon single crystal wafer piece having a diameter of 5 inch was also mirror-polished by the above-described double side polishing method for making a base wafer piece. The polishing was continued to obtain approximately the same surface roughness as the above bond wafer piece by using a double side polishing machine produced by Fujikoshi Machinery Corp. (type of machine: DSP-9B).

The base wafer piece and the above-described bond wafer piece were brought into contact with each other to join, and thereafter a heat treatment of about 1100° C. was carried out to the joined wafer pieces in an atmosphere of oxygen for about 120 minutes, so that the base and bond wafer pieces were firmly bonded with each other.

Next, in the bonded wafer, a thickness of about 500 $\mu$m of the oxide film and the silicon layer of the main surface of the bond wafer piece was removed by surface grinding to make the bond wafer piece thinner, and then the surface of the thinned SOI layer was polished to a thickness of about 4 $\mu$m by using the wax-mounting method which is a similar polishing method to that for the bond wafer piece. Thereafter, the bonded wafer was thinned to make the SOI layer with a thickness of about 0.1 $\mu$m by the above-described PACE method using plasma due to a radio frequency, which is shown in FIGS. 2A–2C, in an atmosphere of $SF_6$. Lastly, the RCA cleaning, i.e., a cleaning by using a mixed liquid of ammonia aqueous solution, aqueous hydrogen peroxide and pure water, or by using a mixed liquid of hydrochloric acid, aqueous hydrogen peroxide and pure water, was conducted on the thinned bonded wafer to complete the SOI bonded wafer having a desired thickness.

The standard deviation of the layer thickness distribution of the SOI bonded wafer produced by such steps was measured by an interferometer computing the layer thickness thereof on the basis of the white light interference patterns. The results are shown in TABLE 1.

In TABLE 1, "Wax-mounting" means a general polishing method using a well-known wax-mounting system; "Double side Polishing" means the above-described double side polishing method; and "Wafer Holding" means the above-described method for polishing while the rear surface of a wafer is held by a soft porous pad containing water therein which can absorb the irregularities on the rear surface of the wafer or the irregularities on the surface of a polishing plate which is in contact with the rear surface of the wafer.

absorbing the irregularities on the rear surface of the wafer or the irregularities on the surface of a polishing plate.

The step of mirror-polishing the front surface of the wafer piece while holding the rear surface thereof by using the wafer holding member was performed by using a polishing machine (type of machine: PS-490) produced by Fujikoshi Machinery Corp. That is, in this step, the wafer piece 41 set in the hole of a wafer holding member 42 was held by surface tension of water which is provided on the surface of a porous pad (backing pad) 43, and polished by rotating a turn table 46 and by using a coarse polishing pad 45 at first and a fine polishing pad 45 subsequently, while an polishing slurry, e.g., an alkali aqueous solution including polishing grains of colloidal silica or the like, is supplied to the polishing pad 45, as shown in FIG. 4. The polishing was continued to obtain approximately the same surface roughness as the bond wafer piece.

The standard deviation of the layer thickness distribution after thinning by the above-described PACE method are shown in TABLE 1.

TABLE 1

| | POLISHING METHOD | | | STANDARD DEVIATION OF THE LAYER THICKNESS AFTER |
|---|---|---|---|---|
| | BASE WAFER | BOND WAFER | SOI LAYER | THINNING |
| EXAMPLE 1 | Double side Polishing | Wax-mounting | Wax-mounting | 1.9 nm |
| EXAMPLE 2 | Wax-mounting | Double side Polishing | Wax-mounting | 1.3 nm |
| EXAMPLE 3 | Double side Polishing | Double side Polishing | Wax-mounting | 1.7 nm |
| EXAMPLE 4 | Wax-mounting | Double side Polishing | Double side Polishing | 1.6 nm |
| EXAMPLE 5 | Double side Polishing | Double side Polishing | Double side Polishing | 1.8 nm |
| EXAMPLE 6 | Wafer Holding | Wax-mounting | Wax-mounting | 1.8 nm |
| EXAMPLE 7 | Wax-mounting | Wax-mounting | Wafer Holding | 1.8 nm |
| EXAMPLE 8 | Wafer Holding | Wafer Holding | Wax-mounting | 1.6 nm |
| EXAMPLE 9 | Wafer Holding | Wax-mounting | Wafer Holding | 1.8 nm |
| EXAMPLE 10 | Wafer Holding | Wafer Holding | Wafer Holding | 1.4 nm |
| COMPARATIVE EXAMPLE 1 | Wax-mounting | Wax-mounting | Wax-mounting | 2.8 nm |

EXAMPLES 2–5

A plurality of bonded wafers were produced by polishing the base wafer pieces, the bond wafer pieces, and the SOI layers after bonded and before thinned by the above-described PACE method, by using various combinations of the double sides polishing method and the polishing method using the well-known wax-mounting system, as shown in EXAMPLES 2–5 in the TABLE 1, respectively, like EXAMPLE 1. The standard deviations of the layer thickness distribution after thinning by the above-described PACE method are also shown in the TABLE.

EXAMPLE 6

A bonded wafer was produced in the same manner as the EXAMPLE 1, except that the mirror polishing for the front surface of the base wafer piece was carried out by the above-described method for polishing while holding the rear surface of a wafer by a wafer holding member while

EXAMPLES 7–10

A plurality of bonded wafers were produced by polishing the base wafer pieces, the bond wafer pieces, and the SOI layers after bonded and before thinned by the above-described PACE method, by various combinations of the polishing method which was carried out while holding the rear surface thereof by using a wafer holding member and a polishing method of the wax-mounting system, as shown in EXAMPLES 7–10 in the Table 1, respectively, like EXAMPLE 1. The standard deviations of the layer thickness distribution thereof after thinning are also shown in TABLE 1.

COMPARATIVE EXAMPLE 1

In order to compare with the embodiments of the invention, a bonded wafer was produced under the same condition as the EXAMPLE 1, except that all of the above-described three polishing steps for the base wafer pieces, the bond wafer pieces, and the SOI layers were carried out by using a polishing method of the wax-mounting system. The standard deviation of the layer thickness distribution thereof after thinning by the above-described PACE method is shown in TABLE 1.

COMPARATIVE EXAMPLE 2

A p-type of silicon single crystal wafer piece having a diameter of 6 inch was mirror-polished for making a bond wafer piece by a well-known polishing method of the wax-mounting system. In this polishing, the entire polishing stock removal was about 10 $\mu$m, and the polishing was continued so long as the rms value of the surface microroughness was larger than 0.3 nm (measured area: 250 $\mu$m×250 $\mu$m) which was measured by the phase shift interferometry method. Next, the polished wafer piece was oxidized in an atmosphere of oxygen including vapor at a temperature of about 1050° C. for about 40 minutes to form an oxide film with a thickness of about 0.5 $\mu$m on the surface of the bond wafer piece.

On the other hand, for making a base wafer piece, the same silicon single crystal wafer piece as the bond wafer piece was polished by a polishing method in which the front surface of the wafer piece was polished while fixing the rear surface of the wafer piece by using a vacuum suction chuck system, and which was liable to create peels in comparison with the polishing method of wax-mounting system. The polishing stock removal and the surface roughness were equivalent to those of the bond wafer piece. However, according to an observation of the front surface of the polished base wafer piece by a magic mirror, the existence of peels was clearly found, in comparison with the case of the bond wafer piece.

The base wafer piece and the above-described bond wafer piece were brought into contact with each other to join, and there after a heat treatment of 1100° C. was carried out to the joined wafer pieces in an atmosphere of oxygen for 120 minutes to firmly bond with each other. Next, in the bonded SOI wafer, a thickness of about 600 $\mu$m of the oxide film and the silicon layer of the main surface of the bond wafer piece was removed to make the bond wafer piece thinner by surface grinding, and then the surface of the thinned SOI layer was polished to a thickness of 3±0.5 $\mu$m by a polishing method which was liable to create peels in comparison with a polishing method of the wax-mounting system, that is, a polishing method in which the front surface of the bonded wafer was polished while fixing the back surface thereof by a vacuum suction holding system (a polishing method similar to that of the base wafer piece). Thereafter, the bonded wafer was thinned to make the SOI layer with a thickness of 0.1 $\mu$m by the above-described PACE method in the same manner as the EXAMPLE 1.

Figure 5:
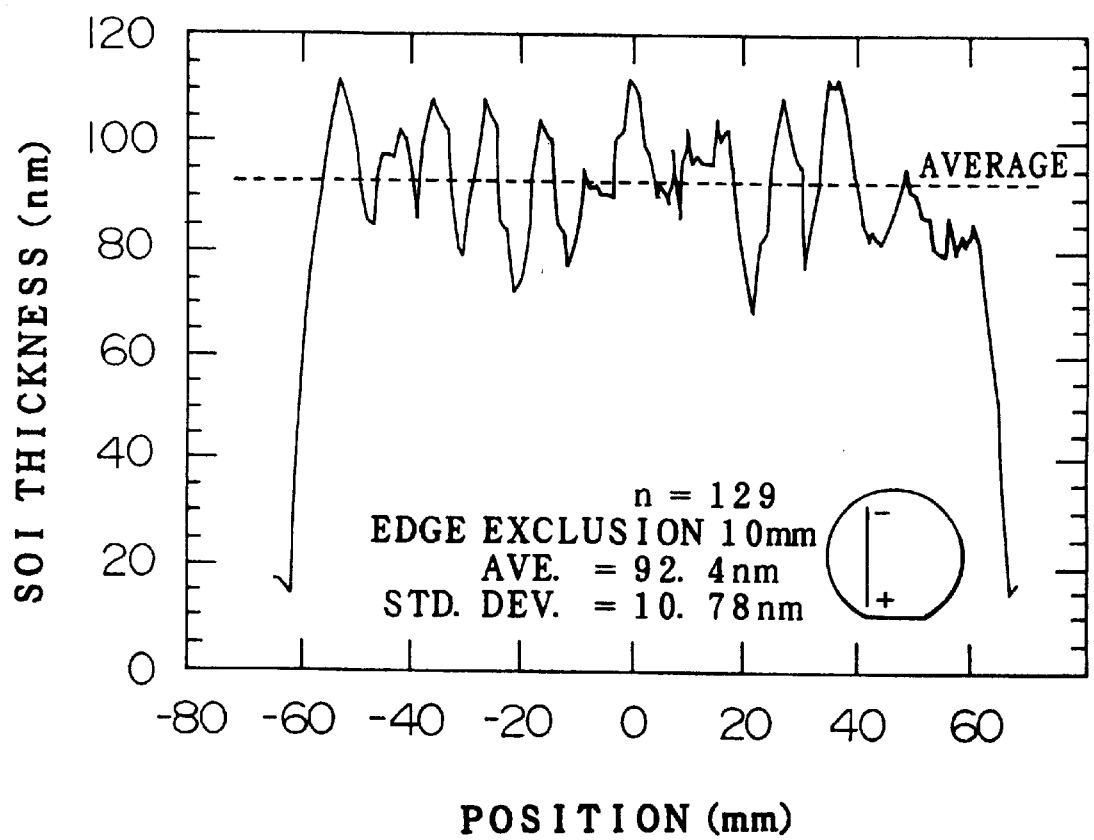
FIG. 5 is a graph showing the layer thickness distribution of a bonded SOI wafer which was thinned by the PACE method after polishing by a wax-mounting polishing method.

The results of the measured thickness of the SOI layer in a diameter direction are shown in FIG. 5. The measurement was carried out by using a contact probe roughness measurement apparatus "TALYSTEP" sold by Rank Taylor Hobson Limited. In this Figure, the cycle of the layer thickness distribution is about 10 mm and the peak-to-valley value thereof reaches about 40 nm (=0.04 $\mu$m), and the layer thickness distribution has a standard deviation not less than 10 nm. From the results,it is understood that according to the above conventional polishing method, even though the bonded wafer is thinned to make the SOI layer with a thickness of 0.1 $\mu$m by the PACE method, the adverse effect of peels which were created during the preceding polishing step cannot be completely compensated.

Although the present invention has been explained according to the embodiments, it should also be understood that the present invention is not limited to the embodiments and that various changes and modifications may be made to the invention without departing from the gist thereof.

For example, the method for manufacturing a bonded wafer according to the present invention which gives advantageous effects of a uniform thickness and a higher processing accuracy to the bonded wafer, can be applied in manufacturing not only a bonded wafer having a thin SOI layer but also a bonded wafer having an SOI layer of a uniform thickness larger than 0.1 $\mu$m and entire surfaces finished with high accuracy. Concretely, it is considered that the invention is applicable to manufacturing a bonded wafer for which a layer thickness allowance within ±0.1 $\mu$m is required, which is thought difficult to be manufactured by only polishing. Further, the invention is not limited to application to SOI techniques. The method of the present invention has basically no limitation with respect to the material for the substrates to be bonded, and it can be also applied to a technique for directly bonding two substrates through no oxide film. For example, the method of the present invention can be also applied to directly bonding heavily and lightly doped silicon substrates to each other, bonding a conductive, semiconductive or superconductive substrate to a quartz substrate, formation of a semiconductor heterostructure such as a direct bonding of different types of compound semiconductor substrates or a bonding of a GaAs substrate on an Si substrate, and the like.

As described above, according to the invention, it is possible to uniformalize the layer thickness of the bonded wafer to have a standard deviation of the distribution thereof not larger than 2 nm and to manufacture a bonded wafer finished with high accuracy.

What is claimed is:

1. A method for manufacturing a bonded wafer comprising the steps of:

mirror-polishing a surface of a first substrate;

mirror-polishing a surface of a second substrate;

joining the mirror-polished surfaces of the first and second substrates together; and applying a heat treatment to the first and second substrates to bond the first and second substrates together, wherein at least one of the two mirror-polishing steps of the surfaces of the first and second substrates is performed by a polishing treatment that prevents the occurrence of peels on a front surface of either one of the first and second substrates having the mirror-polished surface either by existing irregularities on a rear surface of the either one of the first and second substrates having the mirror-polished surface and by a figure of a surface of a polishing plate which is in contact with the rear surface of the either one of the first and second substrates having the mirror-polished surface.

2. The method for manufacturing a bonded wafer according to claim 1, wherein both the first and second substrates comprise silicon.

3. The method for manufacturing a bonded wafer according to claim 1, wherein the polishing treatment is performed by a polishing method in which the either one of the first and second substrates having the mirror-polished surface is held without fixing the rear surface to the polishing plate.

4. The method for manufacturing a bonded wafer according to claim 3, wherein the polishing method is one of either a double side polishing method and a polishing method in which the rear surface of the either one of the first and second substrates having the mirror-polished surface is held on a non-rigid absorption surface of a holding member to absorb the irregularities on the rear surface of the either one of the first and second substrates having the mirror-polished surface.

5. The method for manufacturing a bonded wafer according to claim 3, wherein the polishing method is one in which the front surface of the either one of the first and second substrates having the mirror-polished surface is polished with a polishing pad while the rear surface of the either one of the first and second substrates having the mirror-polished surface is held in a hole of a substrate supporting member having a diameter larger than that of the either one of the first and second substrates having the mirror-polished surface without fixing the rear surface of the either one of the first and second substrates having the mirror-polished surface to the substrate supporting member.

6. A method for manufacturing a bonded wafer comprising the steps of:

mirror-polishing a surface of the first substrate;

mirror-polishing a surface of the second substrate;

forming an insulating film on at least one of the mirror-polished surfaces of the first and second substrates;

joining the mirror-polished surfaces of the first and second substrates together with the insulating film between the mirror-polished surfaces of the first and second substrates; and applying a heat treatment to the first and second substrates to bond the first and second substrates together, wherein at least one of the two mirror-polishing steps of the surfaces of the first and second substrates is performed by a polishing treatment that prevents the occurrence of peels on a front surface of either one of the first and second substrates having the mirror-polished surface either by existing irregularities on a rear surface of the either one of the first and second substrates having the mirror-polished surface and by a figure of a surface of a polishing plate which is in contact with the rear surface of the either one of the first and second substrates having the mirror-polished surface.

7. The method for manufacturing a bonded wafer according to claim 6, wherein both the first and second substrates comprise silicon.

8. The method for manufacturing a bonded wafer according to claim 6, wherein the polishing treatment is performed by a polishing method in which the either one of the first and second substrates having the mirror-polished surface is held without fixing the rear surface to the polishing plate.

9. The method for manufacturing a bonded wafer according to claim 8, wherein the polishing method is one of either a double side polishing method and a polishing method in which the rear surface of the either one of the first and second substrates having the mirror-polished surface is held on a non-rigid absorption surface of a holding member to absorb the irregularities on the rear surface of the either one of the first and second substrates having the mirror-polished surface.

10. The method for manufacturing a bonded wafer according to claim 8, wherein the polishing method is one in which the front surface of the either one of the first and second substrates having the mirror-polished surface is polished with a polishing pad while the rear surface of the either one of the first and second substrates having the mirror-polished surface is held in a hole of a substrate supporting member having a diameter larger than that of the either one of the first and second substrates having the mirror-polished surface without fixing the rear surface of the either one of the first and second substrates having the mirror-polished surface to the substrate supporting member.

11. The method for manufacturing a bonded wafer according to claim 6 further comprising the steps of:

thinning one of the bonded substrates by one of wet-etching and grinding; and polishing the thinned substrate.

12. The method for manufacturing a bonded wafer according to claim 6 further comprising the steps of:

thinning one of the bonded substrates by one of wet-etching and grinding;

polishing the thinned substrate; and further thinning the polished and thinned substrate by vapor-phase etching to form a thin semiconductor layer.

13. The method for manufacturing a bonded wafer according to claim 12, wherein the step of further thinning the polished and thinned substrate by vapor-phase etching comprises measuring a thickness distribution of the polished and thinned substrates that is to be made thinner to make a map of the thickness distribution, and locally thinning a thicker portion of the one of the bonded substrates on the basis of the map by vapor phase etching, which is numerically controlled.

14. A method for manufacturing a bonded wafer comprising the steps of:

mirror-polishing a surface of a first substrate;

mirror-polishing a surface of a second substrate;

forming an insulating film on at least one of the mirror-polished surfaces of the first and second substrates;

joining the mirror-polished surfaces of the first and second substrates together with the insulating film between the mirror-polished surfaces of the first and second substrates;

applying a heat treatment to the first and second substrates to bond the first and second substrates together;

thinning the first substrate of the bonded substrates by one of wet-etching and grinding; and subjecting the thinned first substrate of the bonded substrates to a polishing treatment that prevents the occurrence of peels on a front surface of the thinned first substrate either by existing irregularities on a rear surface of the second substrate and by a figure of a surface of a polishing plate which is in contact with the rear surface of the second substrate.

15. The method for manufacturing a bonded wafer according to claim 14, wherein both the first and second substrates comprise silicon.

16. The method for manufacturing a bonded wafer according to claim 14, wherein the polishing treatment is performed by a polishing method in which the second substrate is held without fixing the rear surface to the polishing plate.

17. The method for manufacturing a bonded wafer according to claim 16, wherein the polishing method is one of either a double side polishing method and a polishing method in which the rear surface of the second substrate is held on a non-rigid absorption surface of a holding member to absorb the irregularities on the rear surface of the second substrate.

18. The method for manufacturing a bonded wafer according to claim 16, wherein the polishing method is one in which the front surface of the thinned first substrate is polished with a polishing pad while the rear surface of the second substrate is held in a hole of a substrate supporting member having a diameter larger than that of the second substrate.

19. The method for manufacturing a bonded wafer according to claim 14 further comprising the steps of:

further thinning the first substrate thinned by one of wet-etching and grinding; and polishing the first substrate by vapor-phase etching.

20. The method for manufacturing a bonded wafer according to claim 19, wherein the step of further thinning the first substrate by vapor-phase etching comprises measuring a thickness distribution of the first substrate to be previously made thinner to make a map of the thickness distribution, and locally thinning a thicker portion of the first substrate on the basis of the map by vapor phase etching which is numerically controlled.

* * * * *